United States Patent
Ito et al.

(10) Patent No.: US 7,989,267 B2
(45) Date of Patent: Aug. 2, 2011

(54) MANUFACTURING METHOD OF SEMICONDUCTOR DEVICE AND MANUFACTURING METHOD OF LEAD FRAME

(75) Inventors: Fujio Ito, Hanno (JP); Hiromichi Suzuki, Tokyo (JP); Akihiko Kameoka, Ogose (JP); Junpei Kusukawa, Hitachinaka (JP); Yoshitaka Takezawa, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 755 days.

(21) Appl. No.: 12/104,154

(22) Filed: Apr. 16, 2008

(65) Prior Publication Data

US 2008/0199987 A1  Aug. 21, 2008

Related U.S. Application Data

(63) Continuation of application No. 11/181,929, filed on Jul. 15, 2005, now Pat. No. 7,374,973.

(30) Foreign Application Priority Data

Jul. 16, 2004 (JP) ................................. 2004-209376

(51) Int. Cl.
*H01L 21/00* (2006.01)

(52) U.S. Cl. ................. 438/123; 257/E21.513
(58) Field of Classification Search .................. 438/123; 257/E23.513
See application file for complete search history.

(56) References Cited

U.S. PATENT DOCUMENTS

| | | | |
|---|---|---|---|
| 5,851,853 | A | 12/1998 | Lee et al. |
| 6,858,473 | B2 | 2/2005 | Hosokawa et al. |
| 7,125,750 | B2 | 10/2006 | Kwan et al. |
| 7,132,755 | B2 | 11/2006 | Hosokawa et al. |
| 7,235,888 | B2 | 6/2007 | Hosokawa et al. |
| 7,262,514 | B2 | 8/2007 | Yoshikawa et al. |
| 7,294,217 | B2 | 11/2007 | Beatson et al. |

FOREIGN PATENT DOCUMENTS

| | | |
|---|---|---|
| JP | 9-153587 | 6/1997 |
| JP | 10-163410 | 6/1998 |

*Primary Examiner* — David A Zarneke
(74) *Attorney, Agent, or Firm* — Antonelli, Terry, Stout & Kraus, LLP.

(57) ABSTRACT

Improvement in the reliability of a semiconductor device is aimed at. By heating a lead frame, after preparing a lead frame with a tape, until a resin molding is performed, at the temperature 160 to 300° C. (preferably 180 to 300° C.) for a total of more than 2 minutes in the atmosphere which has oxygen, crosslinkage density becoming high in resin of adhesives, a low molecular compound volatilizes and jumps out outside, therefore as a result, since a low molecular compound does not remain in resin of adhesives, the generation of copper migration can be prevented.

2 Claims, 13 Drawing Sheets

FIG. 2

| SUBSTANCE NAME | SP VALUE |
|---|---|
| NITRILE RUBBER (NBR) | 8.7~10.5 |
| EPOXY RESIN | 10.9 |
| PHENOL RESIN | 11.3 |
| METHANOL | 14.5 |
| POLYACRYLONITRILE | 15.4 |
| ACETONE | 9.9 |
| BISMALEIMIDE RESIN | 12.0 |

PARTIAL SILVER PLATING STEP

TAPING STEP

MANUFACTURING METHOD OF SEMICONDUCTOR DEVICE AND MANUFACTURING METHOD OF LEAD FRAME

CROSS-REFERENCE TO RELATED APPLICATION

This application is a continuation of U.S. application Ser. No. 11/181,929, filed Jul. 15, 2005 now U.S. Pat. No. 7,374,973. The present application claims priority from Japanese patent application No. 2004-209376 filed on Jul. 16, 2004, the contents of which are hereby incorporated by reference into this application.

FIELD OF THE INVENTION

This invention relates to a semiconductor manufacturing technology, and particularly relates to an effective technology in the application to improvement in the reliability of the semiconductor device using a tape.

DESCRIPTION OF THE BACKGROUND ART

In the conventional semiconductor device using a tape and its manufacturing method, in order to seal a semiconductor chip, in the case where an insulating tape layer is adhered to the leads of a lead frame, or to the metal printed wirings of a tab through an adhesion material layer, the adhesion material layer is formed existing on the leads or metal printed wirings, and not existing in the insulating tape layer surface between the leads of the plurality of leads, or between the plurality of metal printed wirings (for example, refer to Patent Reference 1).

In the conventional semiconductor device using a tape and its manufacturing method, the surface of the leads made of Cu is covered by the metal plating of about 30 micrometers thick of gold, platinum, palladium, indium, chromium, titanium, antimony, rhodium, tantalum and vanadium, the alloy containing such metal, Ag which metal ion cannot move into adhesives, etc. The insulating tape with which adhesives were applied is stuck on a lead via the protective film by metal plating. The metal plating is performed only to the surface of the lead of the taping position on which insulating tape is stuck (for example, refer to Patent Reference 2).

[Patent Reference 1] Japanese Unexamined Patent Publication No. Hei 9 (1997)-153587(FIG. 1)
[Patent Reference 2] Japanese Unexamined Patent Publication No. Hei 10 (1998)-163410(FIG. 1)

SUMMARY OF THE INVENTION

Mainly in the semiconductor device with many pins among semiconductor devices, the semiconductor package of structure which stuck a tape for fixation on inner leads in order to stop deformation and disturbance of the inner leads is known.

In the semiconductor device using a tape, if the lead is formed of the copper alloy, the copper migration phenomenon in which the copper ionized from the lead side of plus potential jumps out, this copper ion moves the layer of adhesives and reaches the adjoining lead of minus potential, and the copper deposits from the lead side of this minus potential, occurs.

In the adhesives, the carbonyl group which exists in them performs high temperature oxidization, a carboxyl group is formed, and this carboxyl group performs complex formation and makes copper ionize. That is, the carbonyl group compound in the adhesives is promoting the reaction.

If copper migration grows at a lead side of minus potential, finally the copper will be connected between adjoining leads, and causing defective lead leak will pose a problem.

These inventors found out that, as a result of examining the heat treatment method as a method of controlling migration, the baking in the air worked effectively in out-gas processing, and the effect which controls generation of migration was very high. These inventors found out that not only ionicity impurities but existence of the low molecular compound (volatilization ingredients, such as a solvent) slightly contained in resin of adhesives reduced the migration-proof characteristic remarkably. The following things can be considered as generation factors by the low molecular compound.

1. Plasticization of base resin by a low molecular compound (volatilization ingredients, such as a solvent), which reduces the elastic modulus of base resin and increases the degree of ion migration.
2. Swelling of base resin by a low molecular compound (volatilization ingredients, such as a solvent), which makes the free volume between the molecules in base resin increase, and increases the degree of ion migration.
3. Carrier action of copper ion, which takes solvation structure and increases the degree of ion migration.

As that to which the migration-proof characteristic is reduced as a low molecular compound (volatilization ingredients, such as a solvent), the existence of a ketone system compound with high solubility and solvation ability is the largest in influence, and subsequently existence of an alcoholic system compound has a bad influence. It became clear that usually, although most low molecular compounds volatilize by heat treatment of a process, the alcoholic system compound in which a boiling point is higher than a ketone system compound remains easily slightly, and existence of few alcoholic system compound, especially methanol of a low molecular weight which remained reduces the migration-proof characteristic remarkably.

The Patent Reference 1 (Japanese Unexamined Patent Publication No. Hei 9 (1997)-153587) has the indication of preventing migration by having composition which does not provide an adhesion material layer between leads. The Patent Reference 2 (Japanese Unexamined Patent Publication No. Hei 10 (1998)-163410) has the indication of preventing migration by having composition which gave plating by the metal through which ion cannot move the inside of adhesives on the surface of the copper lead. However, both the Patent Reference 1 and the Patent Reference 2 have no description of preventing migration by flying outside the low molecular compound contained in adhesives by heat treatment.

The purpose of this invention is to offer a method of manufacturing a semiconductor device and a method of manufacturing a lead frame which can aim at improvement in reliability.

The purposes and the new features of above and others of this invention will become clear from the description and the accompanying drawings of this specification.

It will be as follows if the outline of a typical thing is briefly explained among inventions indicated in a present application.

According to one aspect of the present invention, a manufacturing method of a semiconductor device comprises the steps of: preparing the lead frame over which a tape was stuck via adhesives containing a low molecular compound; connecting a part of the lead frame and a semiconductor chip; connecting electrically the leads of the lead frame and the semiconductor chip; and performing resin molding of the semiconductor chip; wherein after sticking the tape over the lead frame and before performing the resin molding, the lead frame is heated at a temperature of 180 to 300° C. for a total of more than 2 minutes in an atmosphere which has oxygen.

According to another aspect of the present invention, a lead frame over which a tape was stuck via adhesives containing a low molecular compound is prepared; and after sticking the tape over the lead frame and before performing a resin molding, the lead frame is heated at a temperature of 180 to 300° C. for a total of more than 2 minutes in an atmosphere which has oxygen.

According to other aspect of the present invention, a lead frame over which a tape was stuck via adhesives containing a low molecular compound is prepared; and after sticking the tape over the lead frame and before performing a resin molding, the lead frame is heated with 160° C. ≦heating temperature ≦300° C. and a heating total time >2 minutes, in an atmosphere which has oxygen.

According to other aspect of the present invention, a lead frame over which a tape was stuck via adhesives containing a low molecular compound is prepared; and after sticking the tape over the lead frame and before performing a resin molding, the lead frame is heated at a temperature of 180 to 300° C. for a total of more than 2 minutes in a gas atmosphere which lowers an activation energy of a reaction of a molecule.

According to other aspect of the present invention, in a manufacturing method of a semiconductor device using a member over which substrate a conductor part which includes copper or a copper alloy was stuck via thermosetting adhesives, before performing a resin molding, the member is heated at a temperature of 180 to 300° C. for a total of more than 2 minutes in an atmosphere which has oxygen.

According to other aspect of the present invention, a manufacturing method of a lead frame comprises the steps of: sticking a tape via adhesives which contain a low molecular compound over a lead frame which has a plurality of leads; after sticking the tape, heating the lead frame at a temperature of 180 to 300° C. for a total of more than 2 minutes in an atmosphere which has oxygen; and shipping the lead frame.

It will be as follows if the effect acquired by the typical thing among inventions indicated in a present application is explained briefly.

By heating a lead frame, after sticking a tape on a lead frame and before performing a resin molding, at the temperature of 180 to 300° C. for a total of more than 2 minutes in the atmosphere which has oxygen, the hardening reaction accompanied by the oxidization crosslinkage in resin of adhesives can be promoted, and crosslinkage density becoming high, a low molecular compound volatilizes and jumps out outside. Thereby, since a low molecular compound does not remain in resin of adhesives, the generation of migration can be prevented. As a result, improvement in the reliability of a semiconductor device can be aimed at.

BRIEF DESCRIPTION OF THE DRAWINGS

FIG. 2 is a data diagram showing an example of the general solubility parameter (SP value) contained in adhesives;

DETAILED DESCRIPTION OF THE PREFERRED EMBODIMENTS

In the following embodiments, except for the time when particularly required, explanation of the same or same portion is not repeated in principle.

Although it divides and explains to a plurality of sections or embodiments by the following embodiments when there is the necessity for convenience, except for the case where it shows clearly especially, they are not mutually unrelated and one side has relation, such as a modification, details, supplementary explanation, etc. of a part or all of another side.

In cases where the number of elements (the number, a numerical value, quantity, the range, etc. are included) etc. is mentioned in the following embodiments, except for the case where it shows clearly especially and for the case where it is theoretically limited to a specific number clearly etc., they shall be not the thing limited to the specific number but more than the specific number, or less.

Hereafter, the embodiments of this invention are explained in detail based on the drawings. In the all diagrams for explaining embodiments, the same mark is given to the member which has the same function, and explanation of the repetition is omitted.

Embodiment 1

Figure 1:
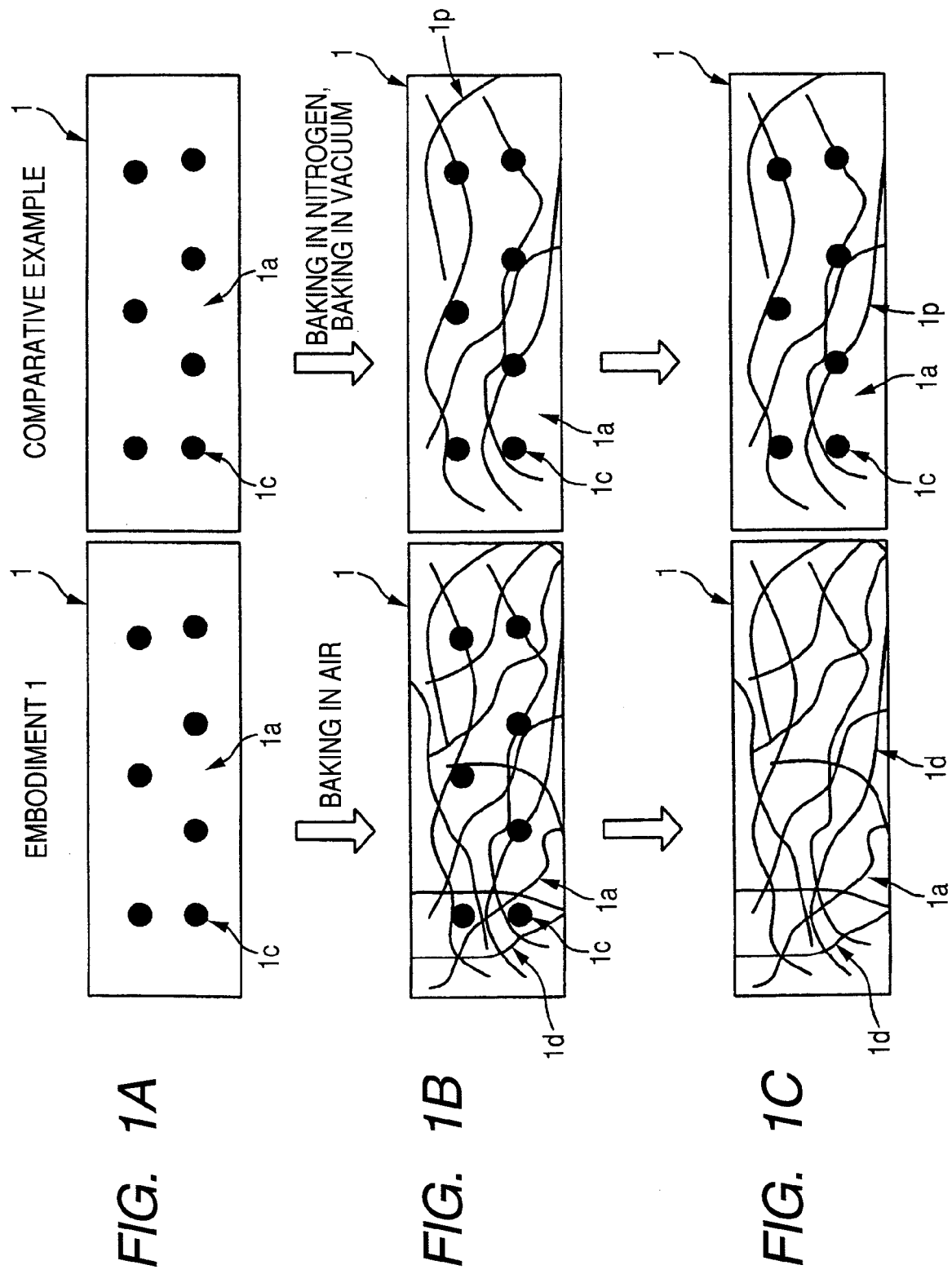
FIGS. 1A to 1C are mimetic diagrams showing an example of each state of the crosslinking reaction of resin of the adhesives of a tape in the manufacturing method of the semiconductor device of Embodiment 1 of this invention, and the crosslinking reaction of resin of the adhesives of a comparative example.
Figure 3:
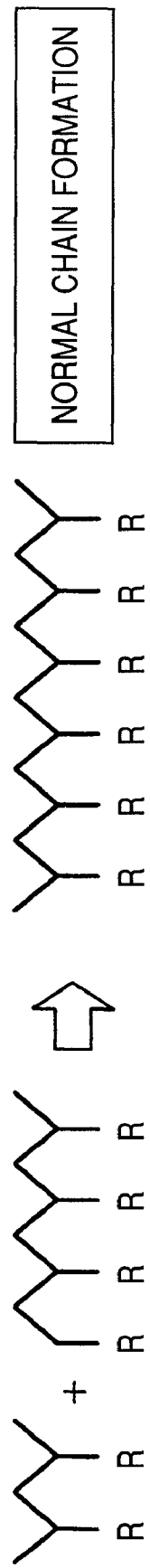
FIG. 3 is a mimetic diagram showing an example of normal chain combination of a molecule.
Figure 4:
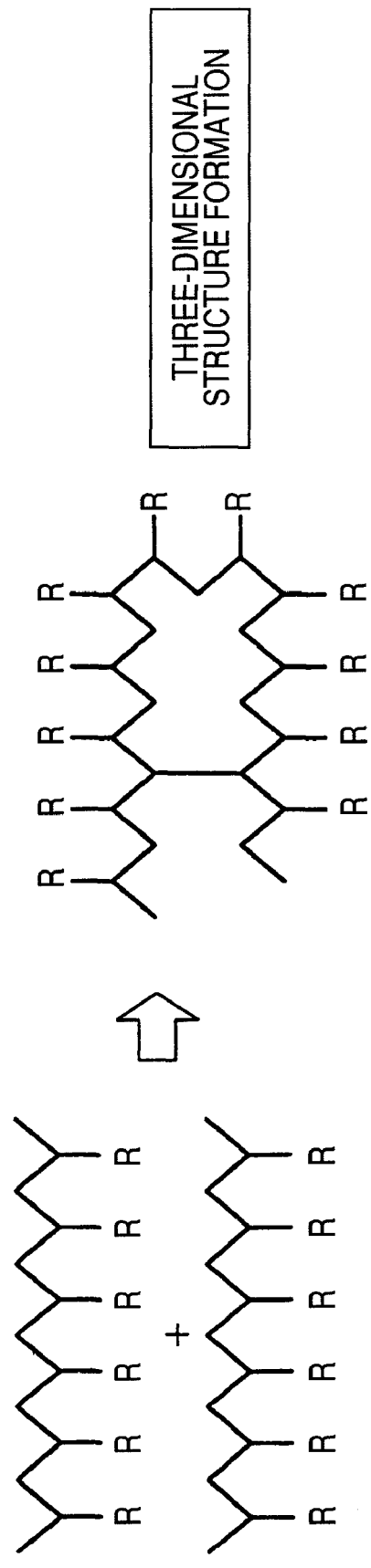
FIG. 4 is a mimetic diagram showing an example of three-dimensional combination of a molecule.
Figure 5:
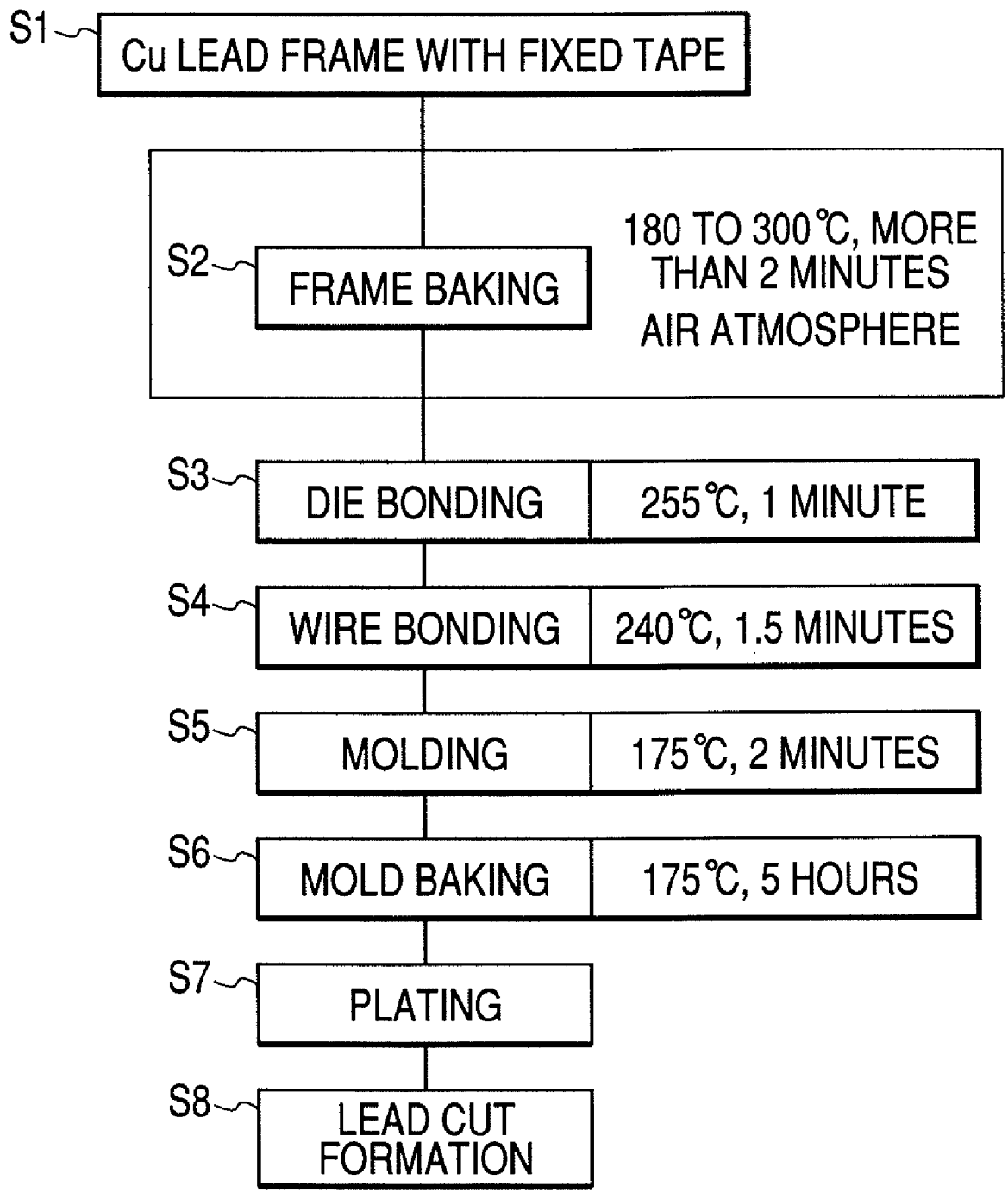
FIG. 5 is a flow diagram showing an example of the assembly procedure with the manufacturing method of the semiconductor device of Embodiment 1 of this invention.
Figure 6:
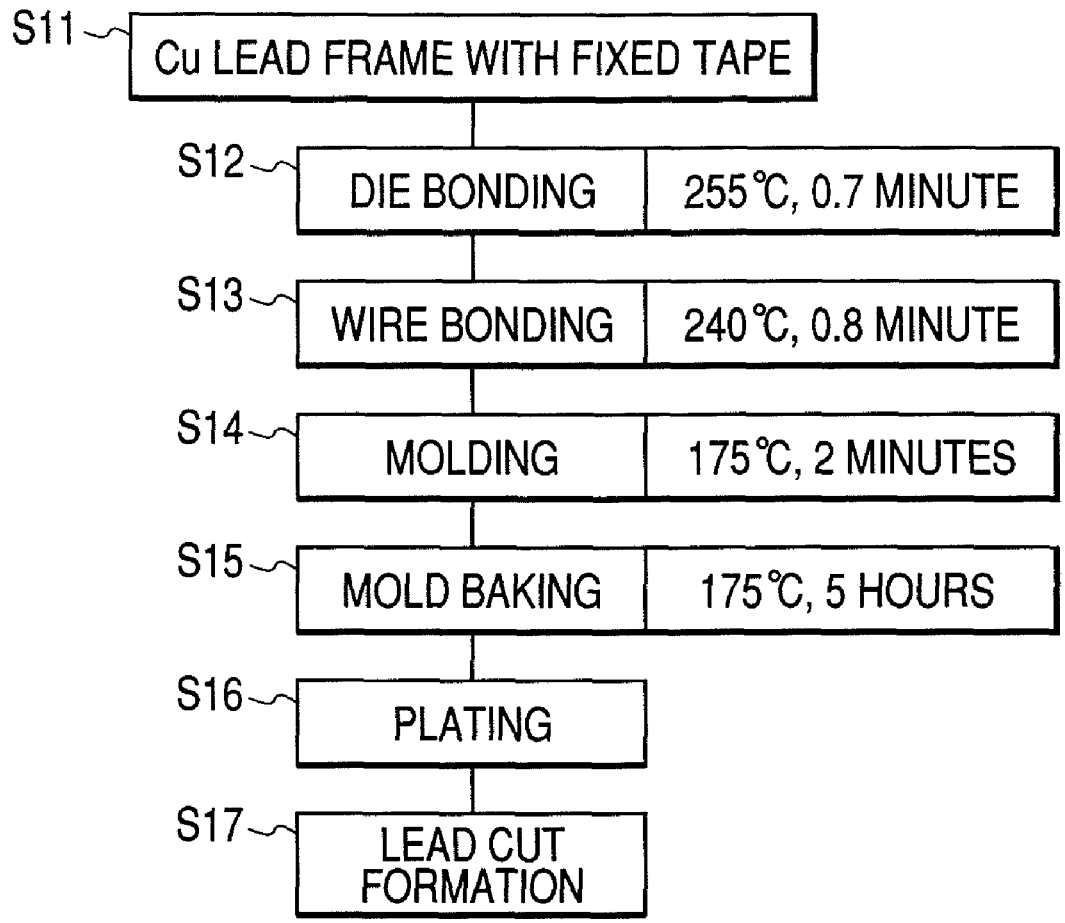
FIG. 6 is a flow diagram showing the assembly procedure of the manufacturing method of the semiconductor device of a comparative example.
Figure 7:
FIG. 7 is a fragmentary sectional view showing an example of the structure of the tape used in the manufacturing method of the semiconductor device of Embodiment 1 of this invention.
Figure 8:
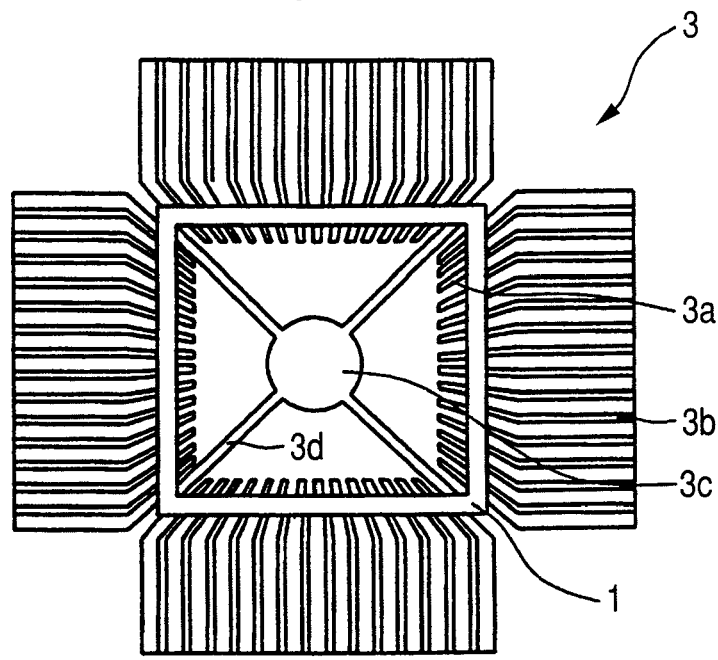
FIG. 8 is a partial plan view showing an example of the structure of a lead frame used in the manufacturing method of the semiconductor device of Embodiment 1 of this invention.
Figure 9:
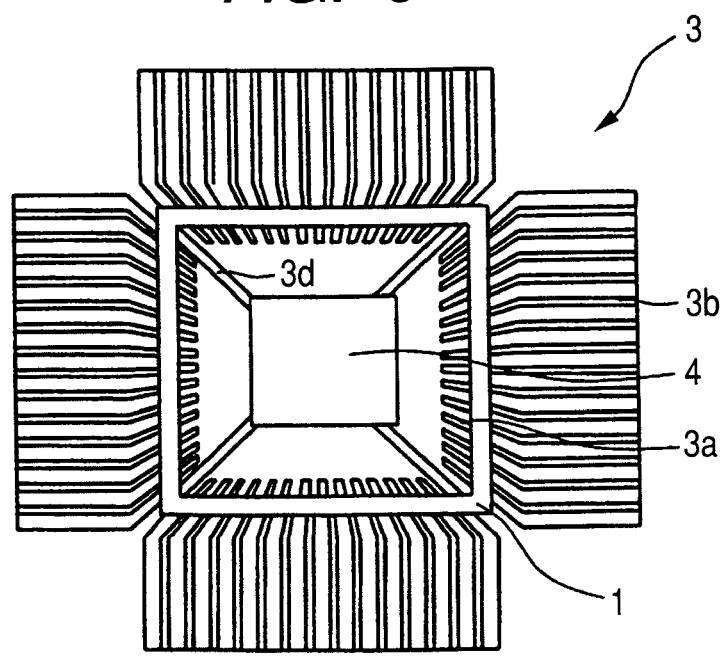
FIG. 9 is a partial plan view showing an example of the structure after the die bonding in the manufacturing method of the semiconductor device of Embodiment 1 of this invention.
Figure 10:
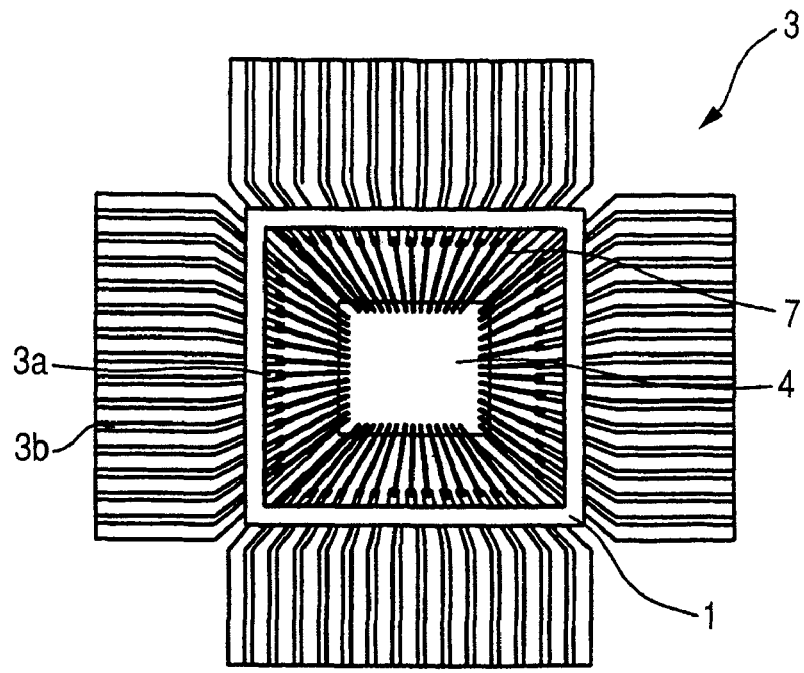
FIG. 10 is a partial plan view showing an example of the structure after the wire bonding in the manufacturing method of the semiconductor device of Embodiment 1 of this invention.
Figure 11:
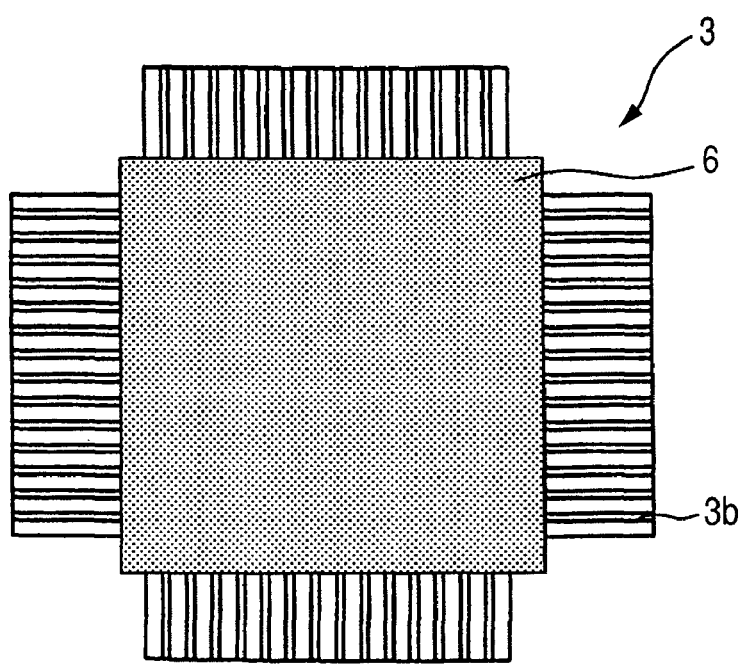
FIG. 11 is a partial plan view showing an example of the structure after the resin molding in the manufacturing method of the semiconductor device of Embodiment 1 of this invention.
Figure 12:
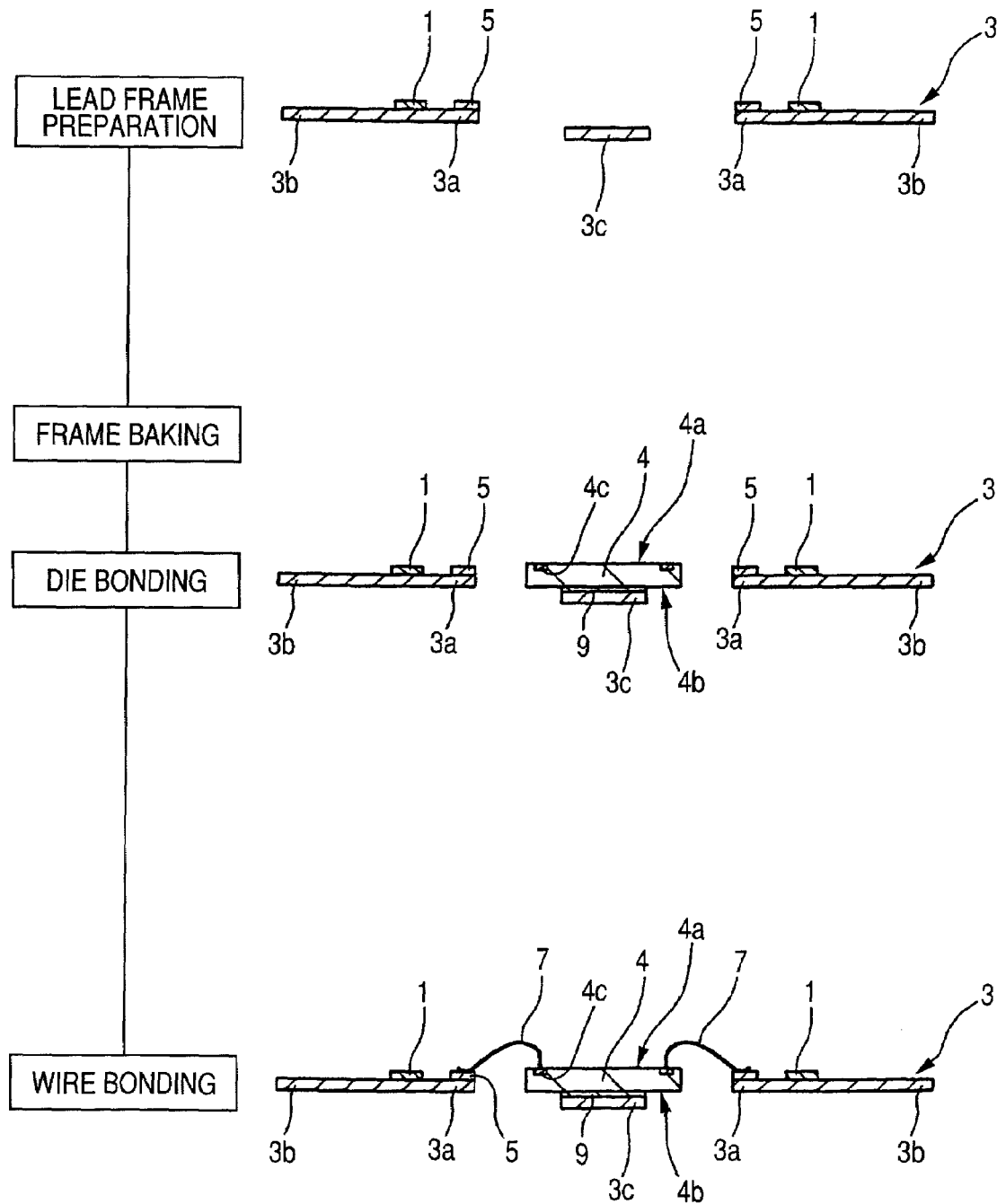
FIG. 12 is a sectional view showing an example of the structure in each step till the wire bonding in the manufacturing method of the semiconductor device of Embodiment 1 of this invention.
Figure 13:
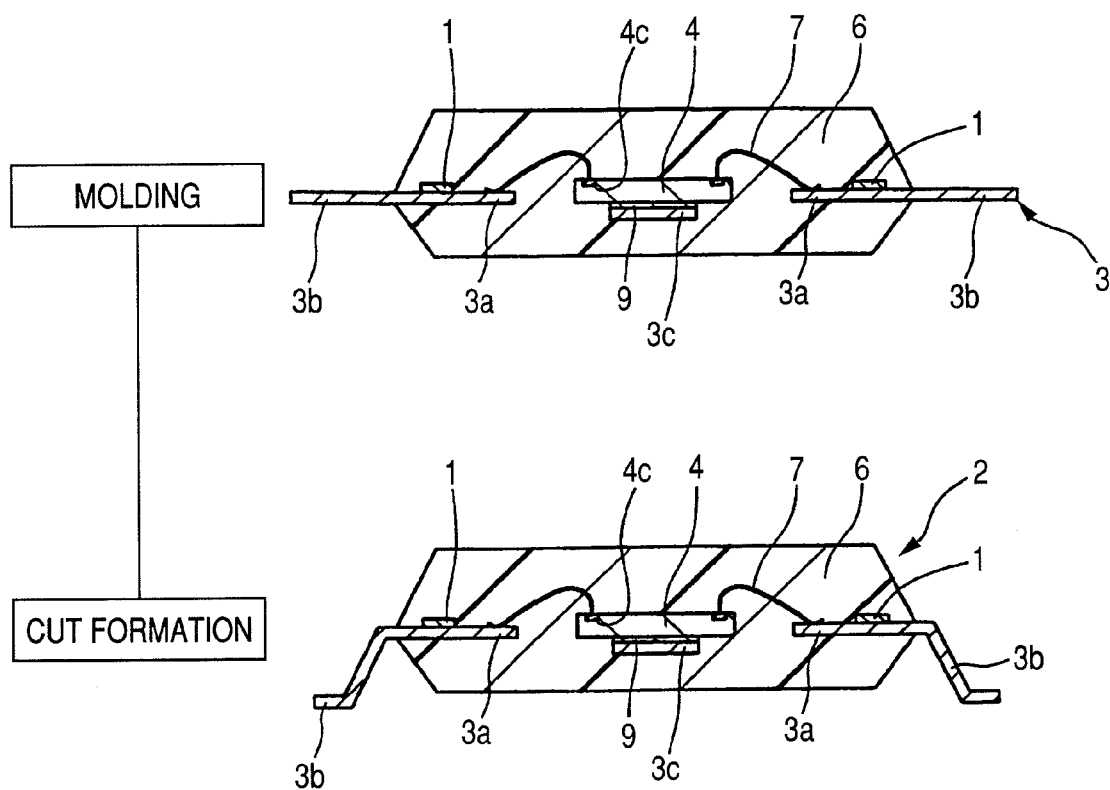
FIG. 13 is a sectional view showing an example of the structure after the resin molding and after the cut formation in the manufacturing method of the semiconductor device of Embodiment 1 of this invention.
Figure 14:
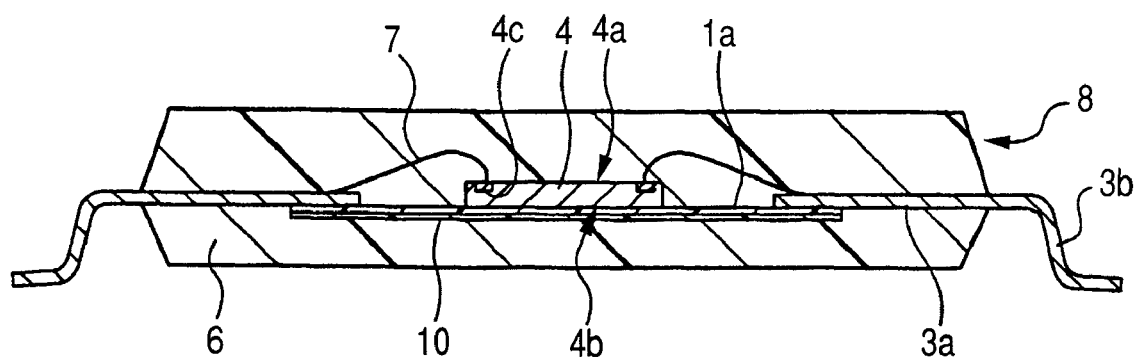
FIG. 14 is a sectional view showing the structure of the semiconductor device of a modification assembled with the manufacturing method of the semiconductor device of Embodiment 1 of this invention.
Figure 15:
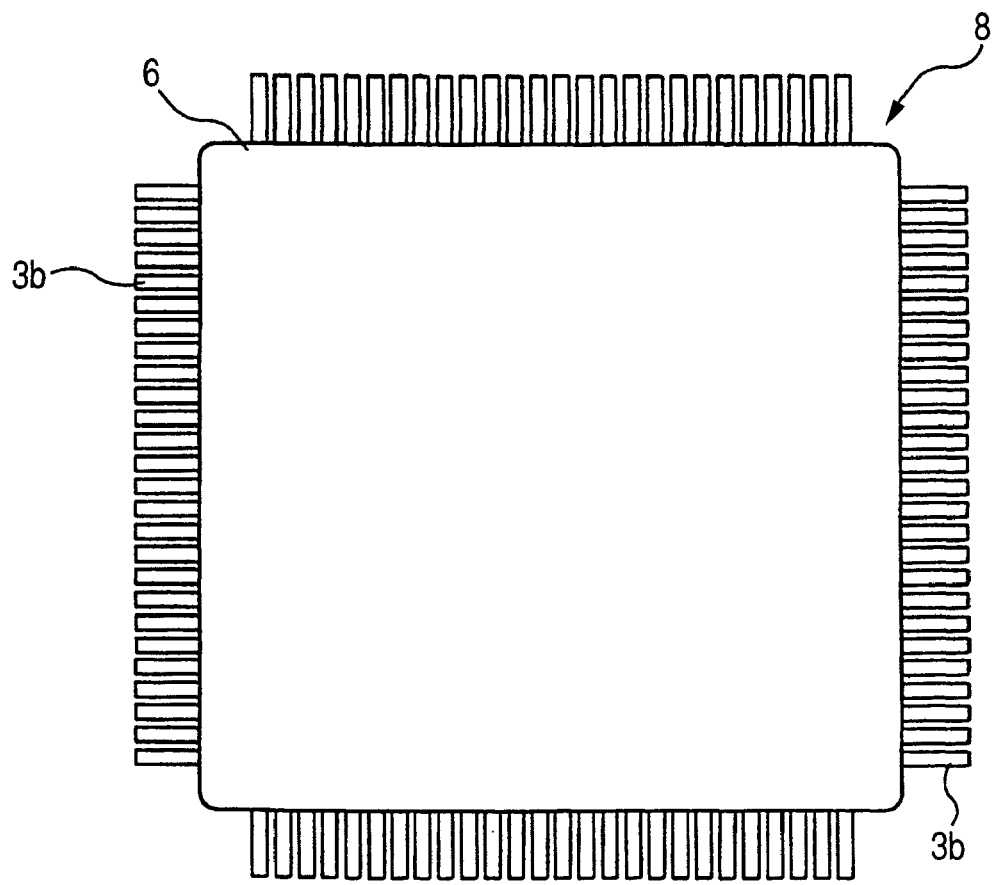
FIG. 15 is a plan view showing the structure of the semiconductor device shown in FIG. 14.
Figure 16:
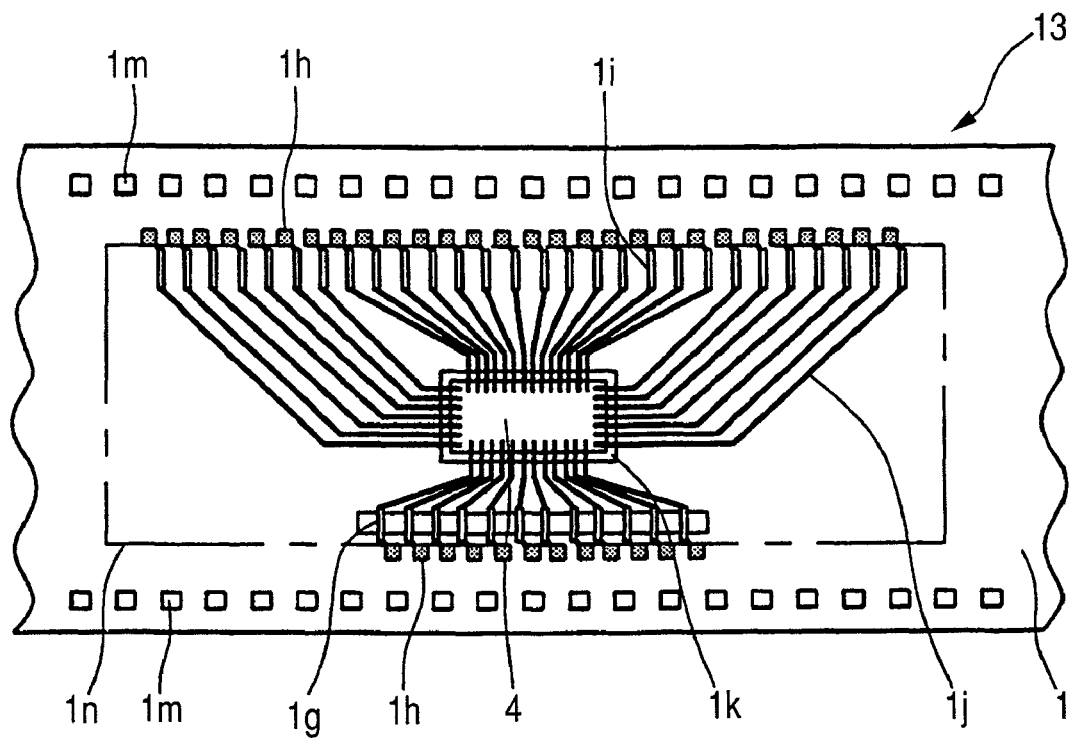
FIG. 16 is a partial plan view showing the structure of the semiconductor device of a modification assembled with the manufacturing method of the semiconductor device of Embodiment 1 of this invention.
Figure 17:
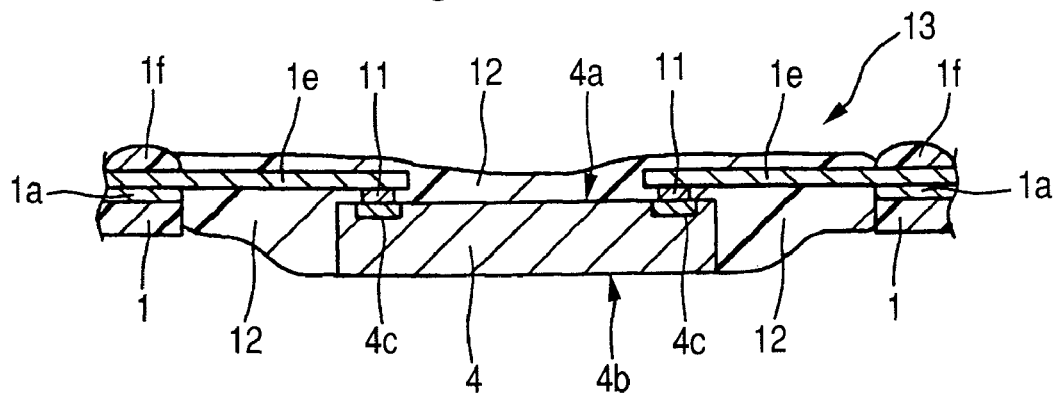
FIG. 17 is a fragmentary sectional view showing the structure of the semiconductor device shown in FIG. 16.

FIGS. 1A to 1C are mimetic diagrams showing an example of each state of the crosslinking reaction of resin of the adhesives of a tape in the manufacturing method of the semiconductor device of Embodiment 1 of this invention, and the crosslinking reaction of resin of the adhesives of a comparative example; FIG. 2 is a data diagram showing an example of the general solubility parameter (SP value) contained in adhesives; FIG. 3 is a mimetic diagram showing an example of normal chain combination of a molecule; FIG. 4 is a mimetic diagram showing an example of three-dimensional combination of a molecule; FIG. 5 is a flow diagram showing an example of the assembly procedure with the manufacturing method of the semiconductor device of Embodiment 1 of this invention; FIG. 6 is a flow diagram showing the assembly procedure of the manufacturing method of the semiconductor device of a comparative example; FIG. 7 is a fragmentary sectional view showing an example of the structure of the tape used in the manufacturing method of the semiconductor device of Embodiment 1 of this invention; FIG. 8 is a partial plan view showing an example of the structure of a lead frame used in the manufacturing method of the semiconductor device of Embodiment 1 of this invention; FIG. 9 is a partial plan view showing an example of the structure after the die bonding; FIG. 10 is a partial plan view showing an example of the structure after the wire bonding; FIG. 11 is a partial plan view showing an example of the structure after the resin molding; FIG. 12 is a sectional view showing an example of the structure in each step till the wire bonding; FIG. 13 is a sectional view showing an example of the structure after the resin molding and after the cut formation; FIG. 14 is a sectional view showing the structure of the semiconductor device of a modification; FIG. 15 is a plan view of the semiconductor device shown in FIG. 14; FIG. 16 is a partial plan view showing the structure of the semiconductor device of a modification; and FIG. 17 is a fragmentary sectional view showing the structure of the semiconductor device shown in FIG. 16.

This Embodiment 1 explains the manufacturing method of a semiconductor device assembled using the lead frame on which the tape was stuck, and, preventing the generation of the copper migration in the semiconductor device, aims at improvement in the reliability of the semiconductor device.

That is, the manufacturing method of the semiconductor device of this Embodiment 1, prevents the generation of copper migration by heating a lead frame 3 in the atmosphere which has oxygen at a predetermined temperature and beyond predetermined time, after sticking a tape 1 on lead frame 3 and before performing a plastic molding, when assembling a semiconductor device using lead frame 3 on which tape 1 was stuck via adhesives 1a containing low molecular compound 1c. Since it cannot be made to volatilize when heating and volatilizing low molecular compound 1c from adhesives 1a if the circumference of adhesives 1a is surrounded by resin for sealing, by the time when a resin molding is performed, lead frame 3 is heated.

The case where adhesives 1a are thermosetting adhesives, low molecular compound 1c contained in adhesives 1a is acetaldehyde, methanol, or acetone, for example, and lead frame 3 is formed of copper or a copper alloy, is taken up, mentioned and explained as an example.

Tape 1 stops disturbance of an inner lead 3a shown in FIG. 8, and prevents deformation, etc. of inner lead 3a.

First, the mechanism which prevents copper migration by heat-treating lead frame 3 on which tape 1 was stuck is explained.

Although low molecular compounds 1c, such as methanol, are what is slightly contained in raw resin of adhesives 1a without removing completely, in order to make it volatilize outside completely as out gas, it is necessary to change solubility parameters of phenol resin, etc. shown in FIG. 2 by raising the crosslinkage density of resin by performing the hardening reaction by baking, and to press out the methanol whose solubility fell from the inside of resin.

Since it becomes a hardening reaction only by heating without oxidization by the baking in nitrogen (N2) atmosphere and by the baking in vacuum atmosphere as shown in the comparative example of FIGS. 1A to 1C in that case, as to crosslinkage 1p, many normal chain structures are formed and crosslinkage density does not fully go up (FIGS. 1A to 1B), and a solubility parameter does not change to the grade which volatilizes low molecular compounds 1c, such as methanol. As a result, low molecular compound 1c remains in the resin (C of the comparative example of FIG. 1C).

On the other hand, in the baking in the atmosphere in the air etc. which has oxygen shown in Embodiment 1 of FIGS. 1A to 1C, in order that the reaction of oxidization crosslinkage 1d may occur, sufficient crosslinkage structure is easily formed in the inside of the resin (FIGS. 1A and 1C). By this, a solubility parameter can change and methanol, i.e., low molecular compound 1c, can be pressed out from the inside of the resin. As a result, low molecular compound 1c does not remain in the resin (FIG. 1C).

Thus, it becomes possible by changing the solubility parameter of the resin by the baking in the air to remove low molecular compound 1c (for example, methanol) to which the migration-proof characteristic is reduced remarkably from adhesives 1a.

As heat treatment conditions of the baking in the air, i.e., atmosphere containing oxygen, (oxygen environment), it is thought that 160 to 300° C./2-minute-plus of a heating total time are enough. According to the check test, the test result that copper migration did not occur in cases where heat-treatment was performed for 5 minutes at 200° C. and for 3 minutes at 240° C., respectively was obtained. In the manufacturing process of the semiconductor device using Cu lead frame with a fixed tape of a comparative example shown in FIG. 6, even if it applies a heat history to lead frame 3 in the die bonding of Step S12 for 0.7 minute at 225° C., and in the wire bonding of Step S13 for 0.8 minute at 240° C., respectively, copper migration has occurred. Therefore, as a total time to apply a heat history to lead frame 3, it is more than 2 minutes, and let heating temperature in that case be the temperature of 160° C. or more in consideration of a margin.

On the baking conditions in the high temperature of 300° C. or more, the embrittlement accompanied by the thermal decomposition reaction of an adhesives resin ingredient is caused conversely, a result in which it will be in the state where the hard cladding layer is formed in the surface, and gas cannot volatilize is brought, and it is not desirable.

Therefore, in the atmosphere which has oxygen, it becomes the processing conditions of 160 to 300° C./2 minute-plus of a heating total time, and preferably, it is 180 to 300° C./more than 2 minutes of a heating total time, and the heat history on the assembling process of a semiconductor device becomes appropriable for bake processing.

Next, the solubility parameter (SP value) shown in FIG. 2 is a numerical value about the polarity showing the ease of swelling of a molecule. For example, in cases where adhesives $1a$ are mixed adhesives of phenol resin and bismaleimide resin, if the hardening reaction of phenol resin in adhesives is promoted by heat treatment, SP value of phenol resin will fall from 11.3, and the difference from 14.5 of methanol will become large. If the difference of this SP value becomes large, methanol will go away outside.

Next, the case where the mixed adhesives of phenol resin and bismaleimide resin are used is taken up as an example as adhesives $1a$. And the hardening reaction (three-dimensional crosslinking reaction) of resin, and the drop of the activation energy of a reaction by containing oxygen in the atmosphere at the time of a reaction are explained.

Adhesives $1a$ (phenol resin+bismaleimide resin) of tape 1 are in the soft half-hardening state which contains an unreacted functional group in large quantities where it is called B stage state, in the stage stuck on lead frame 3 shown in FIG. 8. When these unreacted functional groups react, macromolecule formation of B stage adhesives of a half-hardening state progresses.

The activation energy of the reaction which draws out hydrogen from a polymer molecule (what is called oxidation reaction) falls under oxygen content atmosphere, and oxidation reaction of a polymer molecule occurs frequently also at a comparatively low temperature. Since adhesives $1a$ (phenol resin+bismaleimide resin of a B stage state) of the description in this Embodiment 1 contain the unreacted functional group in large quantities, it is easy to cause oxidation reaction.

Then, by heat-treating adhesives $1a$ of this Embodiment 1 under oxygen content atmosphere, a reactant functional group can be made into a peroxy radical by oxidization, and the crosslinking reaction (oxidization crosslinkage $1d$) which made this the starting point of the reaction is considered to progress easily. As a result, formation of three-dimensional structure and conjugated structure of an adhesives resin ingredient as shown in FIG. 4 progresses. As the proof, the hue of resin assumes the brown resulting from increase of electron transition absorption from the light yellow of B stage. When formation of three-dimensional structure progresses, sufficient crosslinkage structure is easily formed in the inside of resin, the solubility parameter can change, and low molecular compounds $1c$, such as methanol, can be pressed out from the inside of resin.

As compared with this, only the heat hardening reaction of adhesives $1a$ (phenol resin+bismaleimide resin of a B stage state) occurs under the atmosphere which does not contain oxygen, such as nitrogen atmosphere and vacuum atmosphere. And the formation of the three-dimensional structure and conjugated structure of an adhesives resin ingredient accompanying oxidation reaction as shown in FIG. 4 does not take place. And it is thought that the macromolecule formation with which the normal chain molecule became entangled as shown in FIG. 3 has occurred actively. The hue of resin is still the light yellow of B stage as the proof, and increases of electron transition absorption are hardly observed. Therefore, since sufficient crosslinkage structure is not formed in the inside of resin, a solubility parameter cannot fully change, and low molecular compounds $1c$, such as methanol, cannot be pressed out from the inside of resin.

Next, the manufacturing method including heat treatment of lead frame 3 of the semiconductor device of this Embodiment 1 is explained.

As shown in FIG. 5, a Cu lead frame with a fixed tape shown in Step S1 is prepared first. That is, as shown in lead frame preparation of FIGS. 8 and 12, along with inner lead $3a$ sequence, lead frame 3 on which tape 1 of the shape of a square ring was stuck on inner lead $3a$ is prepared. In the lead frame 3, a tab $3c$ which is a chip mounting part, hanging leads $3d$ with which tab $3c$ is supported in the four corner parts, a plurality of inner leads $3a$ arranged around tab $3c$ and a plurality of outer leads $3b$ which lead to each inner lead $3a$ in one, respectively are formed.

Tape 1 prevents deformation of inner lead $3a$ etc. stopping the disturbance of inner lead $3a$, and as shown in FIG. 7, tape 1 includes a layer of adhesives $1a$, and a layer of base film $1b$. Base film $1b$ is 50 micrometers in thickness, and is formed from polyimide etc., for example. Adhesives $1a$ are mixed adhesives which are 50 micrometers in thickness and make phenol resin and bismaleimide resin the main ingredients, for example. Adhesives $1a$ are also thermosetting adhesives, and low molecular compounds $1c$ (impurities), such as methanol, acetaldehyde, or acetone, are contained in these adhesives $1a$.

Lead frame 3 includes copper or a copper alloy, for example. As shown in lead frame preparation of FIG. 12, silver plating 5 is formed at the tip of the surface of the surface side of each inner lead $3a$, namely of the wire connection side.

Then, in the manufacturing method of the semiconductor device of this Embodiment 1, the frame baking shown in Step S2 of FIG. 5, i.e., the heat treatment to lead frame 3 with tape 1, is performed. In that case, lead frame 3 is heated, in the atmosphere which has oxygen, at the temperature of 180 to 300° C., for a total of more than 2 minutes. For example, in the inside of oxygen environment, lead frame 3 is heated at the temperature of 240° C. for 2 to 5 minutes.

Thereby, as shown in FIG. 1B of Embodiment 1, the hardening reaction accompanied by oxidization crosslinkage $1d$ in resin of adhesives $1a$ can be promoted. Crosslinkage density becoming high, low molecular compound $1c$ volatilizes and jumps out outside. That is, low molecular compound $1c$ can be pressed out outside from the inside of resin. As a result, since low molecular compound $1c$ leading to increase of the degree of ion migration does not remain in resin of adhesives $1a$, movement of Cu ion between leads can be lost, therefore the generation of Cu migration can be prevented.

As a result, improvement in the reliability of a semiconductor device can be aimed at.

Improvement in the reliability of lead frame 3 on which tape 1 was stuck can be aimed at.

As long as the atmosphere which heats lead frame 3 is the gas atmosphere which can lower the activation energy of the reaction of a molecule, they may be gas atmosphere other than oxygen environment.

Although, as timing when heat-treatment of lead frame 3 with tape 1 (frame baking) is performed, what is necessary is just to heat-treat between, before performing the molding (resin molding) of Step S5 of FIG. 5, and after sticking tape 1 on lead frame 3, it is preferred to heat-treat even before the wire bonding of Step S4 of FIG. 5.

Since, after wire bonding, an alloy layer is formed when this connected a gold ball, and a pad $4c$ of aluminum of a semiconductor chip 4, and, if heat is applied to this, the alloy layer is spread, and it may cut in reliability examination and may result in the generation of a defective unit, cutting by the alloy layer can be prevented by heat-treating (frame baking) before wire bonding.

In heat-treating lead frame 3 with tape 1 (frame baking) also during wire bonding, and after wire bonding unavoidably, as for the heat treatment time, it is preferred to distribute heat treatment time so that it may become the total time of heat treatment before wire bonding>the total time of heat treatment during and after wire bonding.

Namely, since the desirable processing time of heat treatment of lead frame 3 with tape 1 (frame baking) is 2 to 5 minutes, and the time of wire bonding is about 1.5 minutes, for example as shown in FIG. 5, by making it as the total time of heat treatment before wire bonding>the total time of heat treatment of during and after wire bonding, it is not necessary to set up the time of wire bonding for a long time, and can control that assembly time is prolonged.

Die bonding shown in Step S3 is performed after the end of heat treatment of Step S2 (frame baking) shown in FIG. 5. That is, as shown in die bonding of FIGS. 9 and 12, tab (part) 3c of lead frame 3, and a back 4b of semiconductor chip 4 are connected with silver paste (die-bonding material) 9.

Heat treatment of lead frame 3 with tape 1 (frame baking) may go together at the time of bake processing of silver paste 9 after die bonding of semiconductor chip 4 is performed with silver paste (die-bonding material) 9.

Wire bonding shown in Step S4 of FIG. 5 is performed after die bonding. That is, as shown in the wire bonding of FIGS. 10 and 12, inner lead 3a of lead frame 3 and pad 4c of a main surface 4a of semiconductor chip 4 are electrically connected with a wire 7. Wire 7 is a gold wire, for example.

Since coating of the silver plating 5 is performed near the tip of the surface side of each inner lead 3a in that case, even if heat treatment of lead frame 3 with tape 1 (frame baking) was performed and inner lead 3a has oxidized, silver plating 5 portion at that tip has prevented oxidization, therefore can connect wire 7 to this silver plating 5 portion.

The molding shown in Step S5 of FIG. 5 is performed after wire bonding. That is, as shown in the molding (resin molding) of FIGS. 11 and 13, semiconductor chip 4 and a plurality of wires 7 are sealed by resin molding, and a sealed body 6 is formed. Resin for sealing in that case is a thermosetting epoxy resin etc., for example.

After resin molding, mold baking shown in Step S6 of FIG. 5 being performed, bake processing of resin for sealing after hardening is performed.

Then, plating shown in Step S7 of FIG. 5 is performed. Here, exterior plating of solder plating etc. is given to a plurality of outer leads 3b projected from sealed body 6.

Lead cut formation shown in Step S8 of FIG. 5 is performed after plating formation. Here, as shown in the cut formation of FIG. 13, cutting and formation of outer lead 3b are performed. That is, while performing cutting from lead frame 3 of each outer lead 3b, each outer lead 3b is bent and formed in the shape of a gull wing, and it becomes assembly completion of a QFP (Quad Flat Package) 2.

Next, the semiconductor device of the modification of this Embodiment 1 is explained.

The semiconductor device of the modification shown in FIGS. 14 and 15 is a heat radiation type QFP 8, and is a semiconductor device of the structure where laminated tape member 10 was stuck at the tip of the back side of each inner lead 3a (the surface of the opposite side against the surface which connects wire 7) via adhesives 1a.

Since, also in the case of this heat radiation type QFP 8, the defect by copper migration will occur if each lead which includes inner lead 3a and outer lead 3b is formed of copper or a copper alloy, and low molecular compounds 1c (impurities), such as methanol, acetaldehyde, or acetone, are contained in resin of adhesives 1a, like the manufacturing method of the semiconductor device of this Embodiment 1, by heating lead frame 3 at the temperature of 160 to 300° C. (preferably 180 to 300° C.) for a total of more than 2 minutes in the atmosphere which has oxygen after sticking a tape member 10 on lead frame 3 and before performing a resin molding, the hardening reaction accompanied by oxidization crosslinkage 1d in resin of adhesives 1a can be promoted, low molecular compound 1c can be volatilized and taken out outside, and the generation of migration can be prevented.

As a result, improvement in the reliability of heat radiation type QFP 8 can be aimed at.

The semiconductor device of the modification shown in FIGS. 16 and 17 is a TCP (Tape Carrier Package) 13, and is the semiconductor package in which semiconductor chip 4 is arranged in a device hole 1k mostly formed in the center of tape 1, and a plurality of leads of a copper foil 1e arranged around semiconductor chip 4 and pad 4c of semiconductor chip 4 are electrically connected by a bump 11, and to which the resin molding of semiconductor chip 4, bump 11, and the copper foil 1e is performed by sealing part 12.

In tape 1 of this TCP 13, the lead of copper foil 1e, a wiring part 1j which leads to the lead, and an inner lead 1g and an outer lead 1i which lead to wiring part 1j are provided, and inner lead 1g and outer lead 1i are connected to a test pad 1h. While copper foil 1e and wiring part 1j are stuck on tape 1 via adhesives 1a in that case, wiring part 1j is covered with and insulated by an insulating solder regist 1f.

A plurality of sprocket holes 1m are formed in the bothsides part of the width direction of tape 1 along with regular intervals. The region inside a plurality of test pads 1h provided in both sides serves as a user's area 1n.

Also in this TCP 13, if wiring part 1j, inner lead 1g, and outer lead 1i are formed of copper or a copper alloy, and low molecular compounds 1c (impurities), such as methanol, acetaldehyde, or acetone, are contained in resin of adhesives 1a, the defect by copper migration will occur. Therefore, by heating, after connecting copper foil 1e, wiring part 1j, and tape 1 via adhesives 1a and before performing a resin molding, like the manufacturing method of the semiconductor device of this Embodiment 1, at the temperature of 160 to 300° C. (preferably 180 to 300° C.) for a total of more than 2 minutes in the atmosphere which has oxygen, the hardening reaction accompanied by oxidization crosslinkage 1d in resin of adhesives 1a can be promoted, low molecular compound 1c can be volatilized and taken out outside, and the generation of copper migration can be prevented.

As a result, improvement in the reliability of TCP 13 can be aimed at. Adopting the flexible wiring board which stuck the wiring pattern (conductor part) which includes copper or a copper alloy via thermosetting adhesives on a substrate, and applying the manufacturing method of the semiconductor device of this Embodiment 1 also when using this flexible wiring board in the assembling process of a semiconductor device, by heating at the temperature of 160 to 300° C. (preferably 180 to 300° C.) for a total of more than 2 minutes in the atmosphere which has oxygen before performing a resin molding, the generation of copper migration can be prevented.

Embodiment 2

Figure 18:
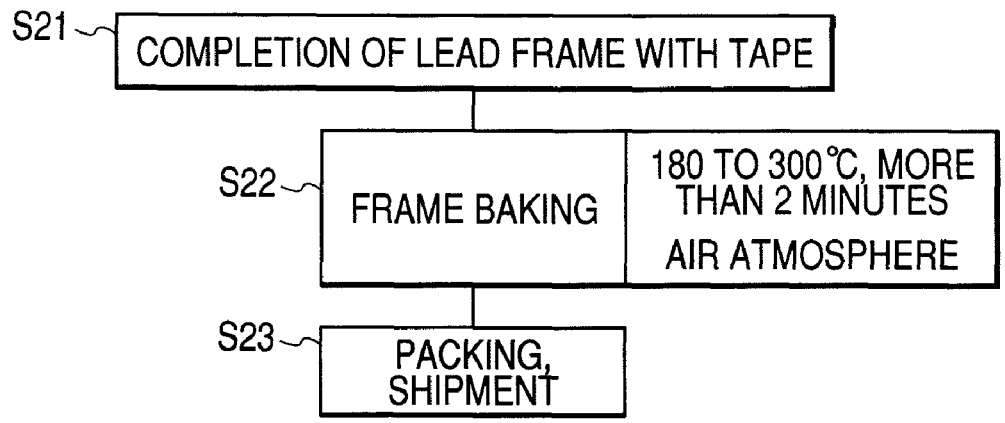
FIG. 18 is a flow diagram showing an example of the procedure of the manufacturing method of the lead frame of Embodiment 2 of this invention.
Figure 19:
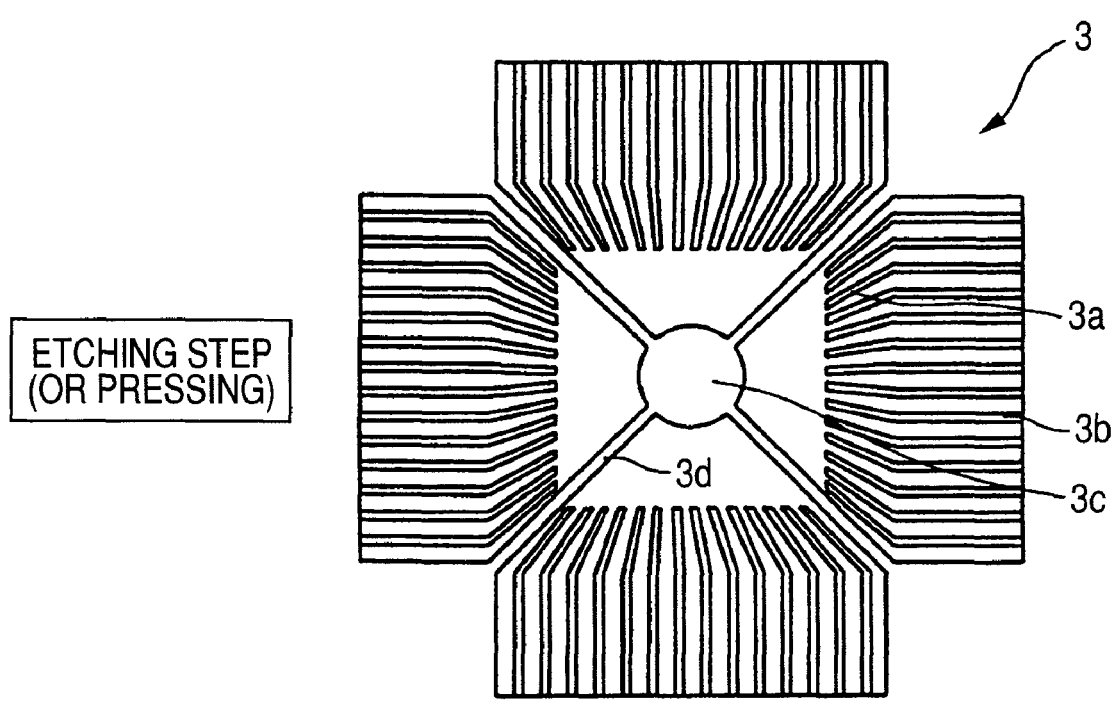
FIG. 19 is a partial plan view showing an example of the structure of the frame after etching in the assembly of the lead frame shown in FIG. 18.
Figure 20:
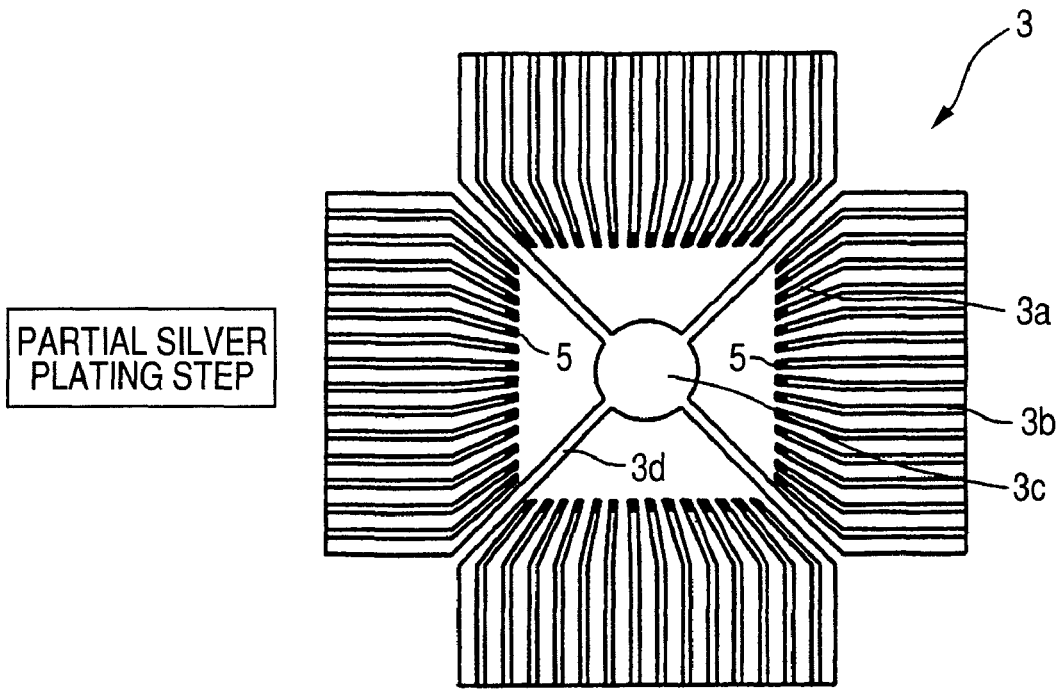
FIG. 20 is a partial plan view showing an example of the structure of the frame after partial silver plating formation in the assembly of the lead frame shown in FIG. 18.
Figure 21:
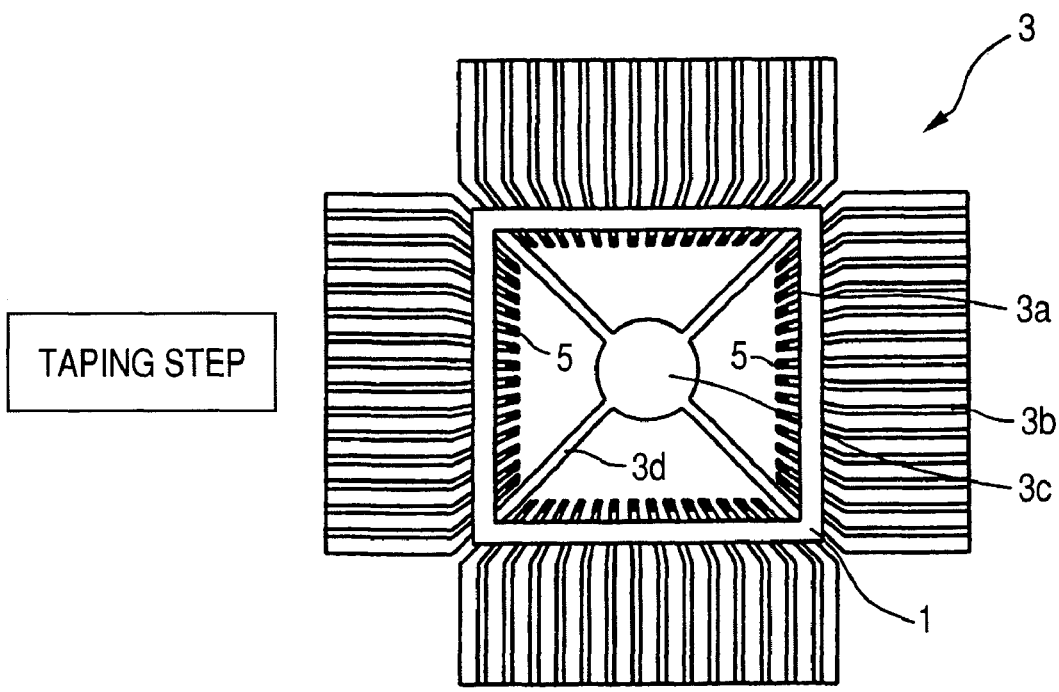
FIG. 21 is a partial plan view showing an example of the structure of the frame after taping in the assembly of the lead frame shown in FIG. 18.

FIG. 18 is a flow diagram showing an example of the procedure of the manufacturing method of the lead frame of Embodiment 2 of this invention;

FIG. 19 is a partial plan view showing an example of the structure of the frame after etching in the assembly of the lead frame shown in FIG. 18; FIG. 20 is a partial plan view showing an example of the structure of the frame after partial silver plating formation in the assembly of the lead frame shown in FIG. 18; and FIG. 21 is a partial plan view showing an example of the structure of the frame after taping in the assembly of the lead frame shown in FIG. 18.

This Embodiment 2 explains the procedure of until it ships lead frame 3 with tape 1 explained in Embodiment 1 by performing frame baking in a lead frame maker. That is, although, in Embodiment 1, the case where lead frame 3 on which tape 1 was stuck beforehand was prepared by a semiconductor device maker, and where frame baking was performed in a semiconductor device maker after that, was explained, this Embodiment 2 explains what performs manufacture of lead frame 3 with tape 1 and further performs frame baking in a lead frame maker, and what ships the lead frame 3.

First, as shown in Step S21 of FIG. 18, lead frame 3 is manufactured. That is, a lead pattern is formed by press processing or etching processing, and lead frame 3 which is shown in FIG. 19 and which has a plurality of leads (inner lead 3a and outer lead 3b) is formed. Lead frame 3 is formed of copper or a copper alloy.

Then, as shown in FIG. 20, the partial silver plating step which gives silver plating 5 at the tip of each inner lead 3a is performed. After that, the taping step shown in FIG. 21 is performed. That is, tape 1 is stuck at lead frame 3 about which silver plating 5 is given at the tip of each inner lead 3a, via adhesives 1a containing low molecular compound 1c (refer to FIG. 1). For example, tape 1 formed in the shape of a square ring is stuck on each inner lead 3a along an inner lead sequence. Adhesives 1a are thermosetting adhesives.

This becomes the completion of the lead frame with a tape shown in Step S21 of FIG. 18.

Then, frame baking shown in Step S22 of FIG. 18 is performed. That is, in the atmosphere which has oxygen, lead frame 3 is heated at the temperature of 160 to 300° C. (preferably 180 to 300° C.) for a total of more than 2 minutes.

Thereby, as for lead frame 3 with a tape, the surface oxidizes and discolors.

Then, packing and shipment which are shown in Step S23 of FIG. 18 are performed.

That is, lead frame 3 with a tape is packed up with the state where it discolored, and is shipped.

Thus, by the thing for which manufacture and frame baking of lead frame 3 with tape 1 are beforehand performed by a lead frame maker, and lead frame 3 is shipped, what is necessary is just to perform the completely same assembly as the former in the assembly of a semiconductor device in the semiconductor device maker supplied in this lead frame 3, and comparing with the cases where frame baking is performed by a semiconductor device maker, the number of steps can be reduced, and the generation of copper migration can also be prevented further.

As mentioned above, although inventions made by these inventors were concretely explained based on the embodiment of invention, it cannot be overemphasized that this invention is not limited to the embodiment of the invention, and it can change variously in the range which does not deviate from the gist.

For example, although the Embodiments 1 and 2 explained the case of acetaldehyde, methanol, or acetone as low molecular compound $1c$ (impurities) volatilized from resin of adhesives $1a$ by heating, low molecular compound $1c$ may not be limited to these substances, and as long as it is low molecular compound $1c$ contained in resin of adhesives $1a$, they may be other substances.

Although the Embodiments 1 and 2 explained the case where phenol resin and bismaleimide resin were the main ingredients, in adhesives $1a$, resin used as the main ingredients of adhesives $1a$ may be other resin.

This invention is suitable for the manufacturing method of a semiconductor device, and the manufacturing method of a lead frame.

What is claimed is:

1. A manufacturing method of a semiconductor device assembled using a lead frame which has a plurality of leads, comprising the steps of:
   (a) providing the lead frame comprised of copper or copper alloy, the lead frame having a chip mounting portion, the plurality of leads arranged around the chip mounting portion, and a tape steadying each of the plurality of leads, the tape being arranged over the plurality of leads via adhesives, wherein the adhesives are mixed adhesives comprised primarily of phenol resin and bismaleimide resin, and including acetaldehyde, methanol or acetone;
   (b) mounting a semiconductor chip on the chip mounting portion, the semiconductor chip having a main surface, and a plurality of pads formed on the main surface;
   (c) electrically connecting the plurality of pads of the semiconductor chip with the plurality of leads via a plurality of wires, respectively;
   (d) forming a sealed body for sealing the semiconductor chip, the plurality of wires, and the plurality of leads with a resin such that a part of each of the plurality of leads is exposed from the sealed body;
   wherein before step (b), the lead frame is heated, at a temperature between 180 degrees and 300 degrees for between 2 minutes and 5 minutes, in an atmosphere including oxygen.

2. A manufacturing method of a semiconductor device according to claim 1, wherein a thickness of the tape is 50 μm.

* * * * *